US 8,572,519 B2

(12) United States Patent
Liu et al.

(10) Patent No.: US 8,572,519 B2
(45) Date of Patent: Oct. 29, 2013

(54) METHOD AND APPARATUS FOR REDUCING IMPLANT TOPOGRAPHY REFLECTION EFFECT

(75) Inventors: Wen Hao Liu, Zhubei (TW); Hsien-Huang Liao, Hsinchu (TW); Chi-Cheng Hung, Toufen Township, Miaoli County (TW); Wen-Chun Huang, Xi-Gang Xiang (TW); Ru-Gun Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 318 days.

(21) Appl. No.: 12/758,147

(22) Filed: Apr. 12, 2010

(65) Prior Publication Data
US 2011/0252387 A1 Oct. 13, 2011

(51) Int. Cl.
*G06F 17/50* (2006.01)
(52) U.S. Cl.
USPC .......................................................... 716/53
(58) Field of Classification Search
USPC .......................................................... 716/53
See application file for complete search history.

(56) References Cited

U.S. PATENT DOCUMENTS

| 6,510,730 | B1 * | 1/2003 | Phan et al. ...................... 73/105 |
| 7,174,532 | B2 * | 2/2007 | Chlipala et al. ................. 716/53 |
| 7,341,939 | B2 | 3/2008 | Oweyang et al. |
| 8,151,221 | B2 * | 4/2012 | Huang et al. .................... 716/53 |
| 8,181,128 | B2 * | 5/2012 | Huang et al. .................... 716/55 |

FOREIGN PATENT DOCUMENTS

TW 580754 9/1991

* cited by examiner

*Primary Examiner* — Jack Chiang
*Assistant Examiner* — Brandon Bowers
(74) *Attorney, Agent, or Firm* — Haynes and Boone, LLP

(57) ABSTRACT

Embodiments of the present disclosure provide methods and apparatuses for integrated circuits. An exemplary integrated circuit (IC) method includes providing an IC design layout that includes a design feature; determining a dimensional difference between the design feature and a corresponding developed photoresist feature of a photoresist layer; modifying the CD of the design feature to compensate for the difference, thereby generating a modified IC design layout; and making a mask using the modified IC design layout.

20 Claims, 8 Drawing Sheets

PR on STI

PR on OD

METHOD AND APPARATUS FOR REDUCING IMPLANT TOPOGRAPHY REFLECTION EFFECT

BACKGROUND

Embodiments of this disclosure relate generally to semiconductor fabrication, and more particularly to a method and apparatus for reducing implant topography reflection effects.

In conventional methods of lithography patterning to a photoresist layer, light may be reflected by the topography of a substrate. For example, the presence of shallow trench isolation (STI) features within the substrate may cause such reflections. Reflected light may cause unintended variations in areas of the photoresist, such as critical dimension (CD) variations of photoresist features as compared to IC design layout features. Furthermore, implant topography reflection may induce photoresist line peeling or "trench scum."

Photoresist regions that are defined as dark regions on a mask may be subject to a certain level of exposure due to reflected radiation. If the intensity of the reflected radiation is above a certain exposure threshold, a dark region could effectively become exposed. Dark regions that become exposed as a result of reflected radiation may be referred to as "reversed regions."

The CD of a photoresist feature in a reversed region may vary locally. Accordingly, adjusting mask bias on a global basis cannot fix this issue, because the variation is not standard across the photoresist. This may be especially true with complicated layout designs that have complex topography. Furthermore, adding a global rule to enlarge smaller patterns is a feed-back compensation solution that requires a wafer-level check, and therefore is not adequate in all respects.

In other conventional methods of lithography patterning, a developable bottom anti-reflective coating (DBARC) layer is deposited on a wafer to prevent reflection. As described in U.S. Pat. No. 7,341,939 to Oweyang et al., a photoresist layer is deposited upon the DBARC layer and the wafer is selectively exposed to irradiation. Although, this conventional solution prevents topography reflection, it is not adequate in all respects.

Thus, there is a need for a method and apparatus for locally compensating CD variation caused by topography reflection.

SUMMARY

One of the broader forms of an embodiment of the invention involves an integrated circuit (IC) method that includes providing an IC design layout that includes a design feature; determining a dimensional difference between the design feature and a corresponding developed photoresist feature of a photoresist layer; modifying the CD of the design feature to compensate for the difference, thereby generating a modified IC design layout; and making a mask using the modified IC design layout.

Another of the broader forms of an embodiment of the invention involves an IC method that includes determining a total light intensity exposure for a portion of a photoresist layer. The total light intensity exposure is determined using a masked light intensity component and a reflected light intensity component. Furthermore, the method includes creating an optical proximity correction (OPC) model that uses the total light intensity exposure to identify a feature of an IC design layout that requires a local bias to compensate for a difference between a CD of the feature of the IC design layout and the CD of a corresponding feature of the photoresist layer, wherein the difference is due to the total light intensity exposure. In addition, the method includes making a mask using the OPC model.

Yet another of the broader forms of an embodiment of the invention involves an apparatus, having a computer-readable medium, the computer-readable medium having instructions executable by the processor. The instructions determine a total light intensity exposure for a portion of a photoresist layer, wherein the total light intensity exposure is determined using a masked light intensity component and a reflected light intensity component. Furthermore, the instructions create an optical proximity correction (OPC) model that uses the total light intensity exposure to identify a feature of an IC design layout that requires a local bias to compensate for a difference between a critical dimension (CD) of the feature of the IC design layout and the CD of a corresponding feature of the photoresist layer, wherein the difference is due to the total light intensity exposure. The instructions also create a mask model using the OPC model.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
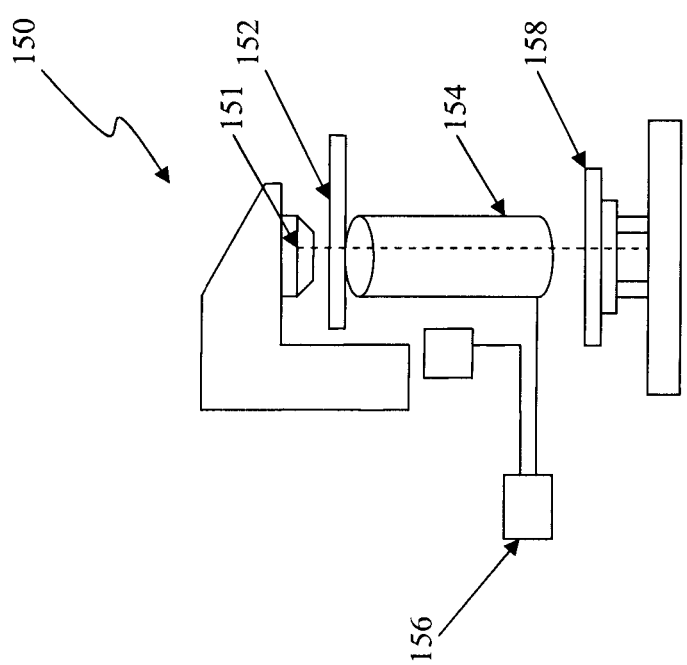
FIG. 1 is a schematic diagram illustrating a lithography apparatus according to aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a representative lithography apparatus 150 that is adapted to implement a lithography process. The lithography apparatus 150 includes a radiation energy source 151 to generate radiation beam such as ultraviolet (UV) beam, a reticle 152, a projection lens 154, an alignment laser source 156, and a wafer stage 158. An IC design layout may be implemented within the reticle 152, and then projected onto a wafer during exposure. Upon exposure, a physical wafer pattern is created.

Figure 2:
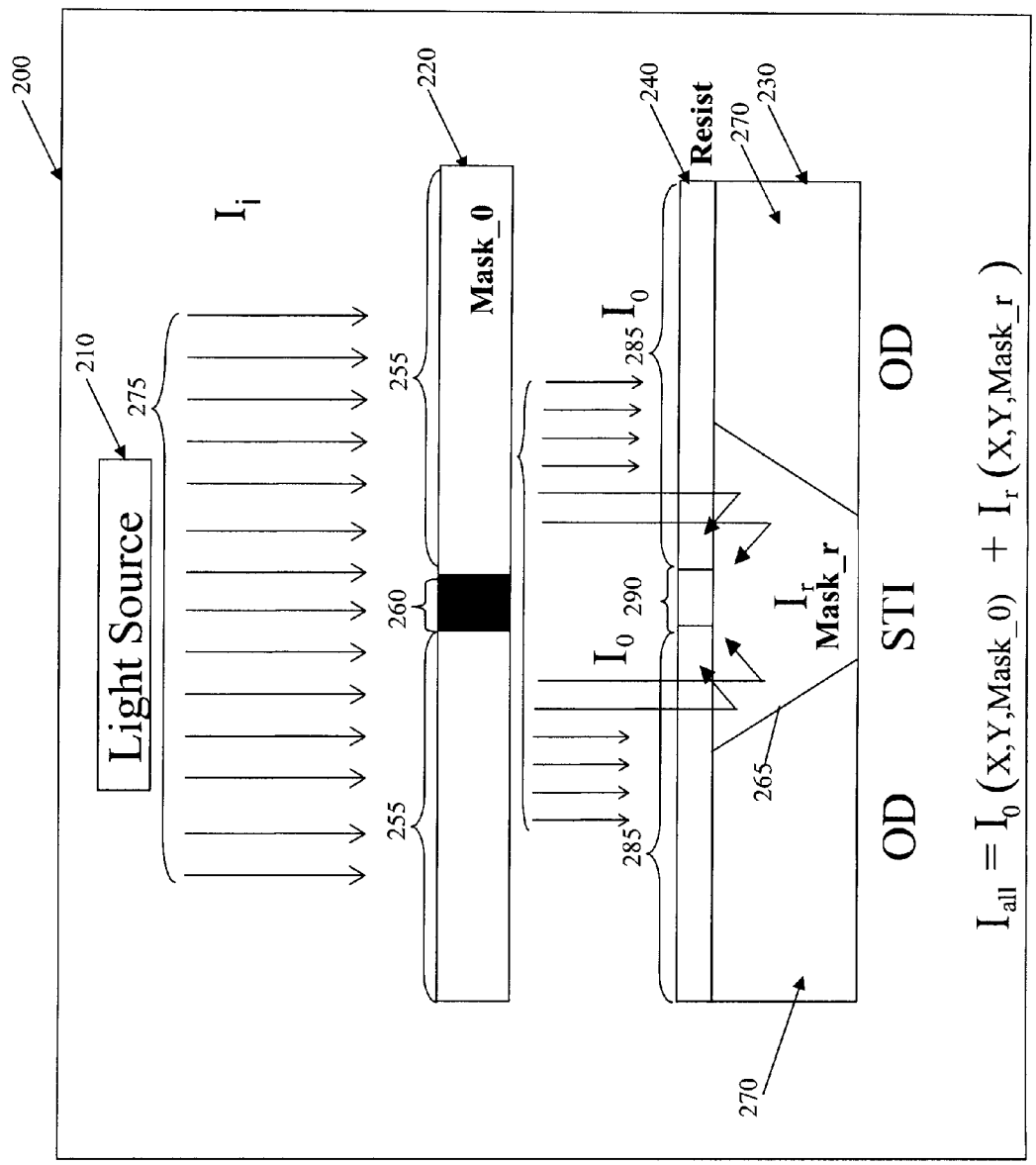
FIG. 2 is a schematic diagram illustrating a lithography process according to aspects of the present disclosure.

Referring now to FIG. 2, shown is a schematic diagram of an exemplary lithography process 200. The lithography process 200 may be implemented by the lithography apparatus 150 shown in FIG. 1. In the lithography process 200, a light source 210, a mask 220 (Mask_0), a topography layer 230 (Mask_r), and a photoresist layer 240 are provided. The mask 220 includes a design layout having light regions 255 and a dark region 260. In other embodiments, the mask 220 may have any configuration of light regions 255 and dark regions 260. The topography layer 230 includes a shallow trench isolation (STI) feature 265, and a plurality of OD features 270. In other embodiments, the topography layer 230 may have any configuration of features.

During an exemplary operation of the lithography process 200, the light source 210 provides light 275 having an initial light intensity ($I_i$) to the mask 220. A portion 280 of the light 275 passes through the light regions 255 of the mask 220 towards the photoresist layer 240. This portion 280 will have a masked light intensity ($I_0$). A second portion of the light 275 strikes the dark region 260 of the mask 220 and does not proceed past the mask 220. The portion 280 of the light 275 that passes through the light regions 255 will expose the photoresist layer 240, thereby forming light regions 285 on the photoresist layer 240. Portions of the photoresist layer 240 that are not exposed by the portion 280 of the light 275, will remain dark, thereby forming dark region 290.

Certain features in the topography layer 230, such as the STI feature 265, may allow a reflected portion 295 of the light 275 to pass through the photoresist layer 240 and reflect off a surface of the topography layer 230. This reflected portion 295, which will have a reflected light intensity ($I_r$), will be directed back towards the photoresist layer 240. If the reflected light intensity is above a certain threshold, then additional exposure of the photoresist layer 240 may occur when the reflected portion 295 strikes the photoresist layer 240. For example, if the reflected light intensity is above a certain threshold, and strikes the dark region 290 of the photoresist, then the dark region 290 may reverse to become lighter than intended. However, if the reflected light intensity is below the threshold, then the dark region 290 may not be affected by exposure to the reflected portion 295. Portions of the photoresist layer 240 that are reversed may be referred to herein as "reversed regions."

Changes in the photoresist layer 240 caused by the reflected portion 295 of the light 275 may result in a change to the CD of a photoresist layer feature. Such changes are local because they vary depending on the topography of the topography layer 230. Accordingly, such changes cannot be addressed by applying a global bias. Instead, local bias should be determined and applied for each feature.

Figure 3:
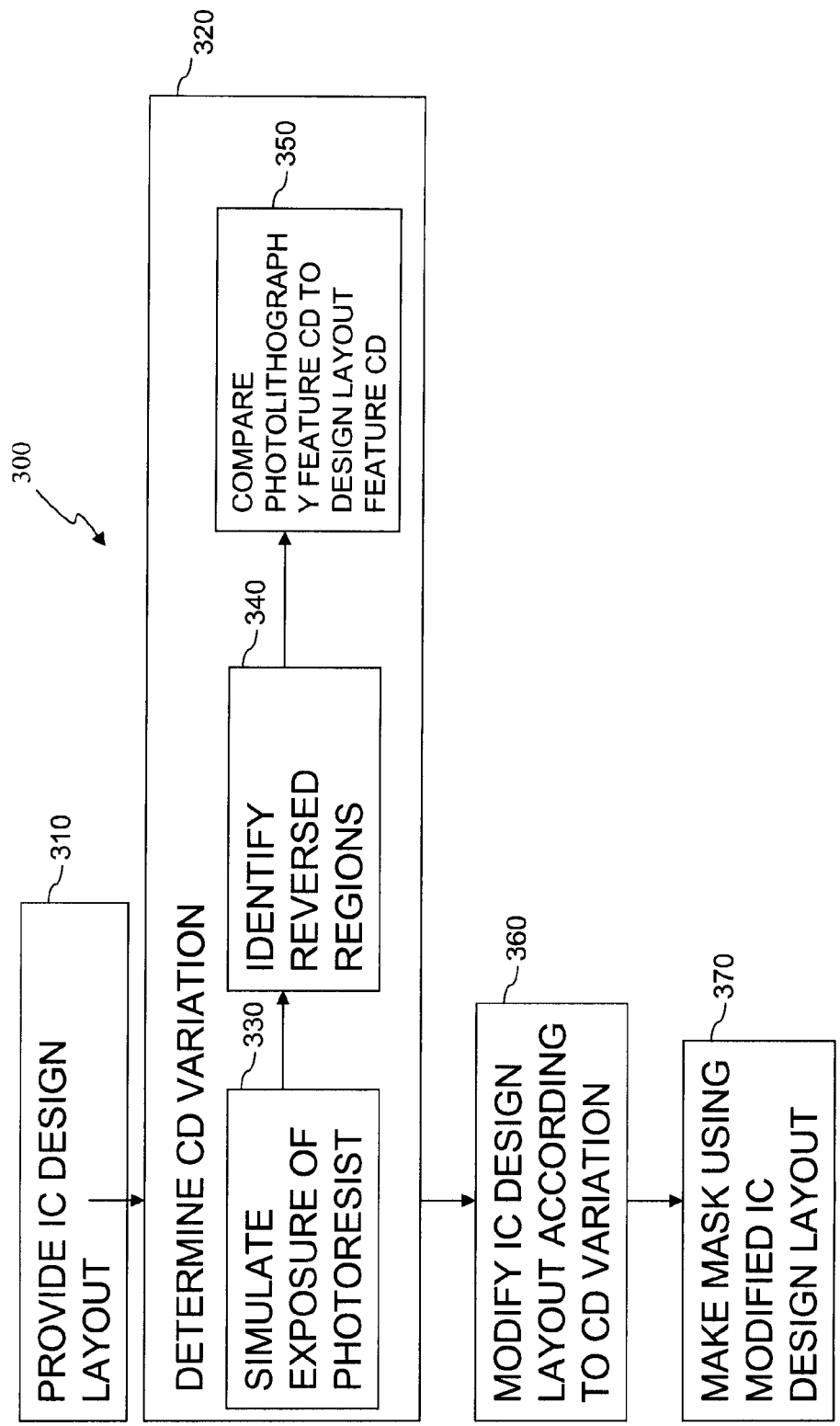
FIG. 3 is a schematic diagram illustrating an IC method according to aspects of the present disclosure.

Referring now to FIG. 3, shown therein is an IC method 300 that may be used to determine local bias to compensate for a CD variation that is caused by the topography effect. The method 300 includes providing an IC design layout at block 310. CD variation is determined at block 320.

CD variation determination at block 320 is uses a model that determines whether a total light intensity striking a portion of a photoresist layer during exposure will cause a difference in a CD of a photoresist feature and a CD of a corresponding design feature. The model includes simulating exposure of a photoresist at block 330, identifying reversed regions (e.g., regions where the total intensity exceeds a predetermined threshold) at block 340, and comparing the CD of the simulated photolithography features formed during simulated exposure to the CD of corresponding design layout features at block 350. At block 330, simulating exposure of the photoresist may include using an integration model to determine a reflection intensity component of the total light intensity. In an embodiment, the photolithography layer features corresponding to the reversed regions identified at block 340 are prioritized for CD comparisons at block 350. In another embodiment, identifying reversed regions at block 340 is optional, and all photolithography layer features are examined for CD variations. An exemplary model is further discussed below with respect to FIG. 5.

In another embodiment, determining CD variation at block 320 may be done using data collected from wafers that have been physically produced. For example, the CD of a feature on a photoresist layer 140 that has been physically exposed using the IC design layout provided at block 310 may be compared to the intended CD of a corresponding feature of the IC design layout. The CD of the photoresist feature could be based on after-development-inspection (ADI) data related to the mask. However, in other embodiments, other data may be used to determine the CD of the photoresist feature.

At block 360, the IC design layout provided at block 310 is modified according to the CD variation determined at block 350. A mask is then modified at block 370 using the modified IC design layout.

Figure 4:
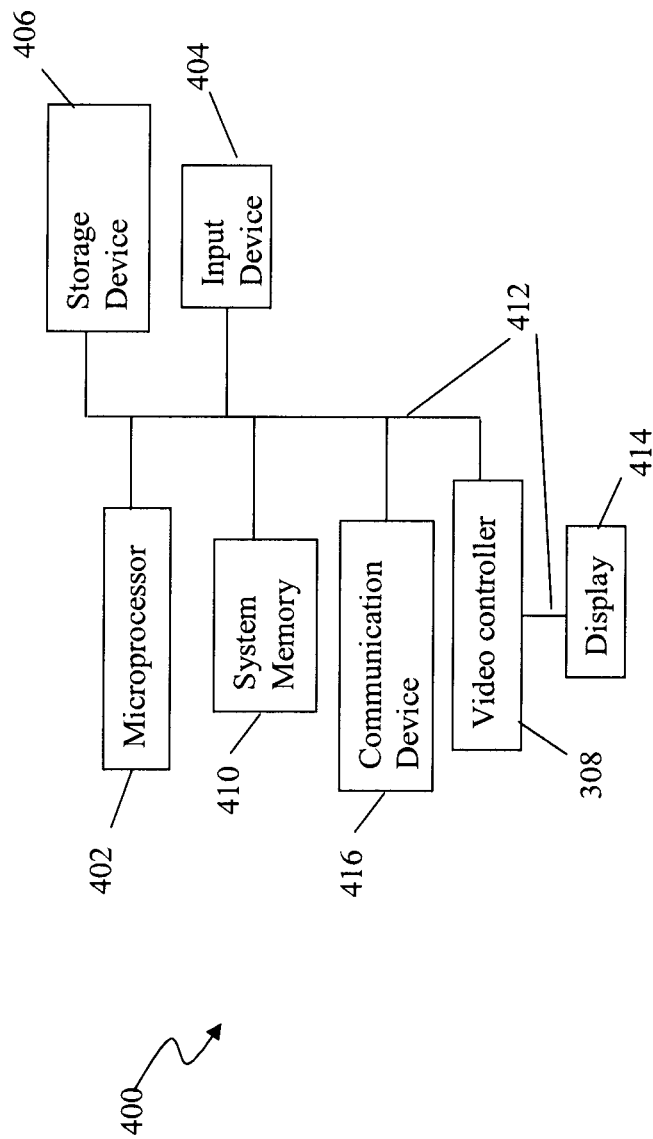
FIG. 4 is a schematic diagram illustrating a computer system according to aspects of the present disclosure.

Referring now to FIG. 4, shown therein is an illustrative computer system 400 for implementing embodiments of the methods described above. Computer system 400 includes a microprocessor 402, an input device 404, a storage device 406, a video controller 408, a system memory 410, a display 414, and a communication device 316 all interconnected by one or more buses 412.

The storage device 406 could be a floppy drive, hard drive, CD-ROM, optical drive, or any other form of storage device. In addition, the storage device 306 may be capable of receiving a floppy disk, CD-ROM, DVD-ROM, or any other form of computer-readable medium that may contain computer-executable instructions.

Further communication device 416 could be a modem, network card, or any other device to enable the computer system to communicate with other nodes. It is understood that any computer system could represent a plurality of interconnected (whether by intranet or Internet) computer systems, including without limitation, personal computers, mainframes, PDAs, and cell phones.

A computer system typically includes at least hardware capable of executing machine readable instructions, as well as the software for executing acts (typically machine-readable instructions) that produce a desired result. In addition, a computer system may include hybrids of hardware and software, as well as computer sub-systems.

Hardware generally includes at least processor-capable platforms, such as client-machines (also known as personal computers or servers), and hand-held processing devices (such as smart phones, personal digital assistants (PDAs), or personal computing devices (PCDs), for example). Further, hardware may include any physical device that is capable of storing machine-readable instructions, such as memory or other data storage devices. Other forms of hardware include hardware sub-systems, including transfer devices such as modems, modem cards, ports, and port cards, for example.

Software includes any instructions stored in any computer-readable medium, including without limitation RAM or ROM, and instructions stored on other devices (such as floppy disks, flash memory, or a CD ROM, for example). Software may include source or object code, for example. In addition, software encompasses any set of instructions capable of being executed in a client machine or server.

Combinations of software and hardware could also be used for providing enhanced functionality and performance for certain embodiments of the present disclosure. One example is to directly manufacture software functions into a silicon chip. Accordingly, it should be understood that combinations of hardware and software are also included within the definition of a computer system and are thus envisioned by the present disclosure as possible equivalent structures and equivalent methods.

Computer-readable mediums include passive data storage, such as a random access memory (RAM) as well as semi-permanent data storage such as a compact disk read only memory (CD-ROM). In addition, an embodiment of the present disclosure may be embodied in the RAM of a computer to transform a standard computer into a new specific computing machine.

The computer system 300 may be designed to work on any specific architecture. For example, the system may be executed on a single computer, local area networks, client-server networks, wide area networks, internets, hand-held and other portable and wireless devices and networks.

Figure 5:
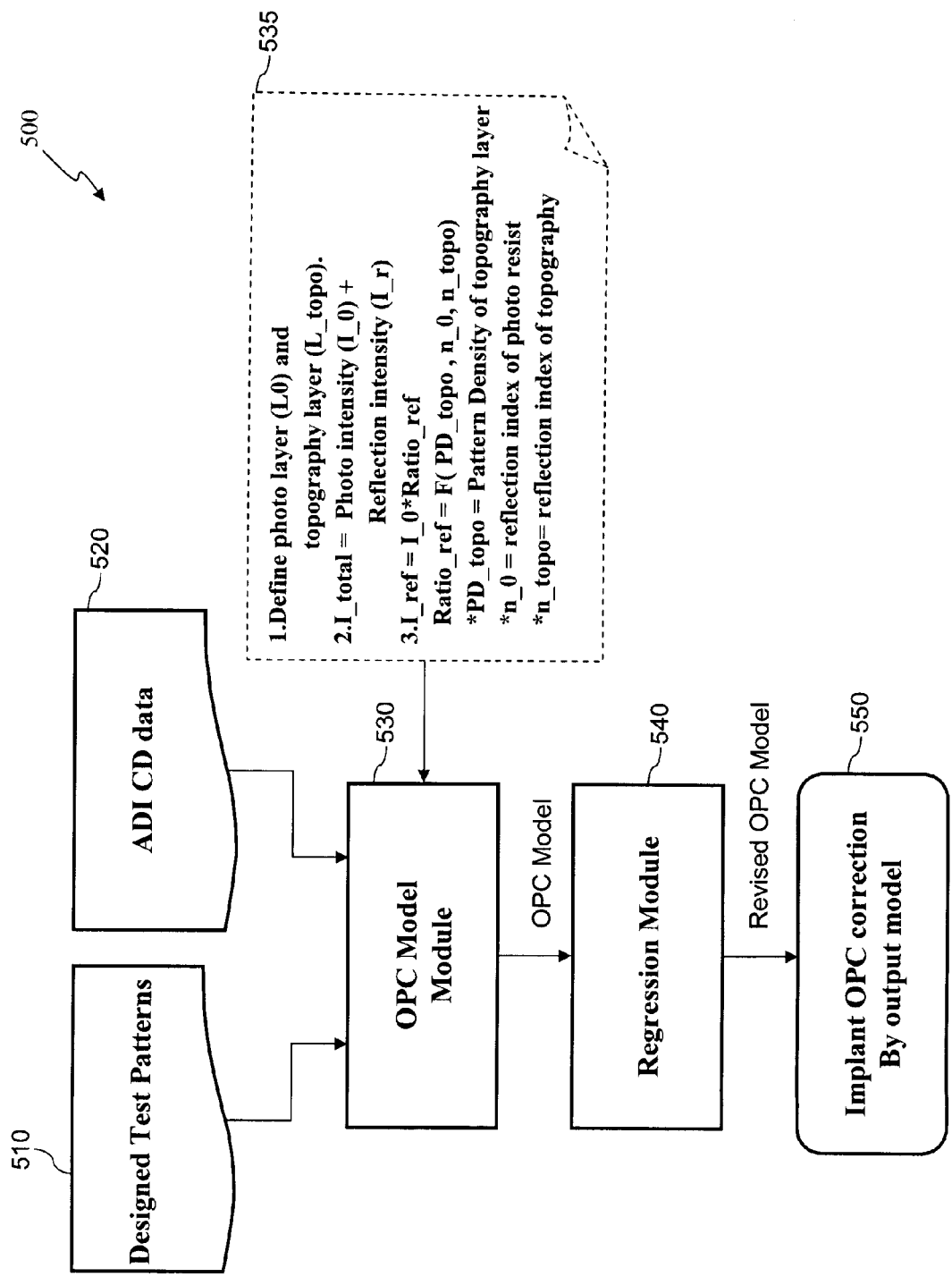
FIG. 5 is a schematic diagram illustrating software according to aspects of the present disclosure.

Referring now to FIG. 5, with continued reference to FIGS. 2-4, an embodiment of software 500 that implements an embodiment of the method 300 is illustrated. The software 500 is installed on the storage device 406, and is executable by the microprocessor 402. Data generated and used by the software 500 may be stored partially in the system memory 410, and output is provided to the display 414 via the video controller 408.

Figure 6B:
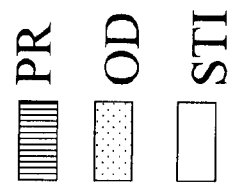
FIG. 6 is a schematic diagram illustrating a test pattern according to aspects of the present disclosure.
Figure 6B:
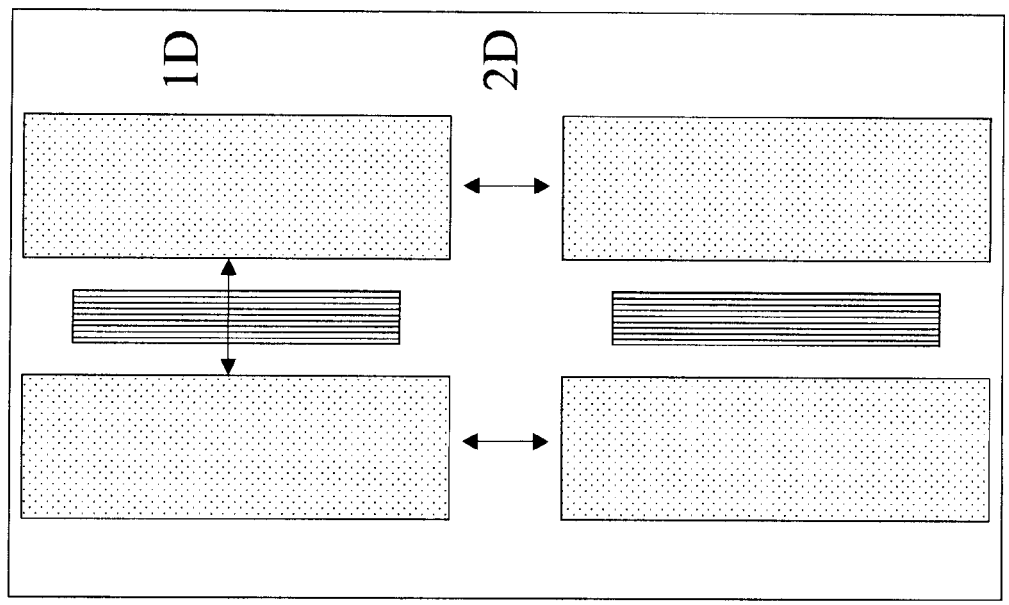
Figure 6A:
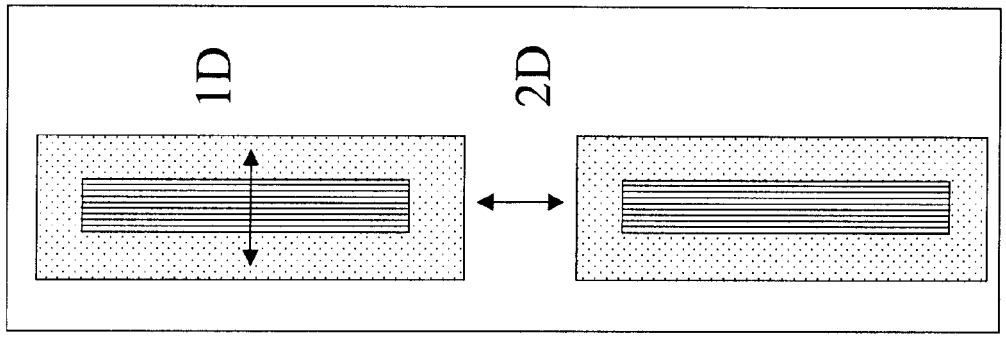
Figure 7A:
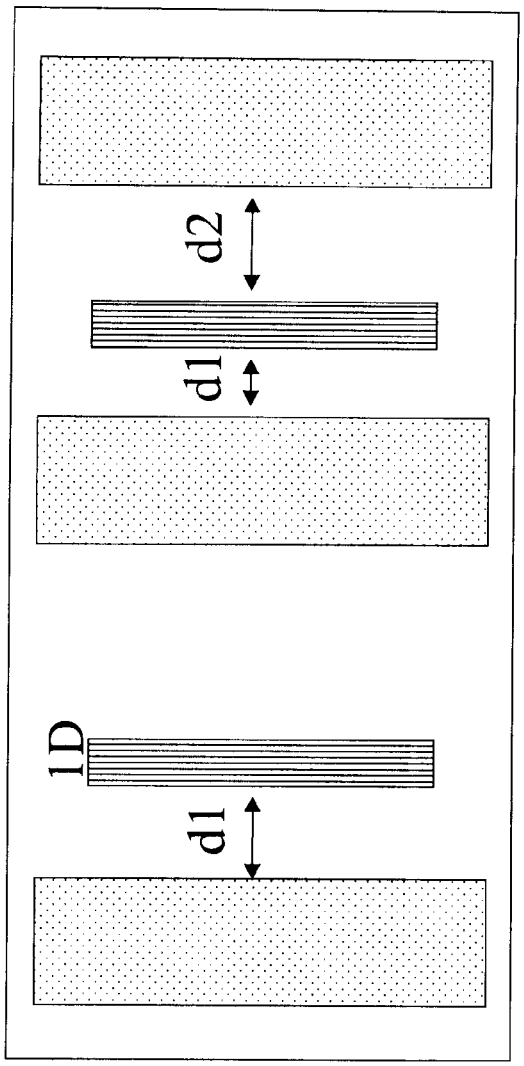
FIG. 7 is a schematic diagram illustrating a test pattern according to aspects of the present disclosure.
Figure 7B:
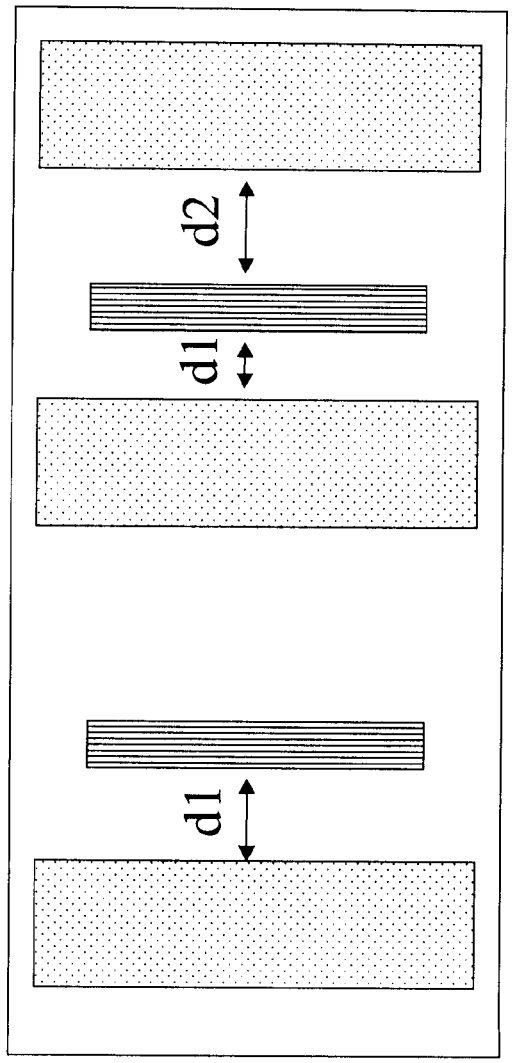

The software 500 begins with providing designed test pattern data 510 and ADI CD data 520 as inputs to the OPC model module 530. The designed test patterns may be used to tune one or more parameters tested by the OPC model module 530. In an embodiment, the designed test pattern data 510 may be test patterns similar to those shown in FIGS. 6a-6b and FIGS. 7a-7b. However, in other embodiments, the test patterns may be any conventional pattern known in the art. In an embodiment, in order to simplify the pattern types, a design rule may be implemented that requires the implant layer to fully cover an OD layer. In embodiments, the photoresist layer is an implant layer test pattern. FIG. 6A and FIG. 7A illustrate the test patterns on OD and FIG. 6B and FIG. 7B illustrate the test patterns on STI. FIG. 6A and FIG. 6B are symmetry test patterns, while FIG. 7A and FIG. 7B are asymmetry test patterns.

Referring back to FIG. 5, the OPC model module 530 also receives reflection model data 535 as input. Reflection model data 535 includes a photoresist layer model and a topography layer model. The photoresist layer model is based on the photoresist layer 240 shown in FIG. 2, and the topography layer model is based on the topography layer 230, which is also shown in FIG. 2.

The photoresist layer model is divided into multiple logical portions. For example, the photoresist layer model may be divided into portions that correspond to features of the underlying topography model (e.g., a logical portion may include the STI feature 265 and the OD features 270). For each logical portion, the total light intensity ($I_{total}$) exposure for the corresponding logical portion of the photoresist layer model is determined.

The total light intensity ($I_{total}$) is determined by adding the masked light intensity ($I_0$) and the reflected light intensity ($I_r$) for the corresponding logical portion. The values of the masked light intensity and the reflected light intensity are then determined using an integration model. For example, in an embodiment, the model calculation depending on Hopkin's equation is determined using the following equation:

$$I(X, Y) = \int\int_{x_1, y_1} \int\int_{x_2, y_2} \text{Source}(x_1 - x_2, y_1 - y_2)\text{Pupil}(x_1, y_1)Pupil^*(x_2, y_2) \times$$
$$\text{Mask}(X - x_1, Y - y_1)Mask^*(X - x_2, Y - y_2)dx_1 dy_1 dx_2 dy_2$$

Where I relates to intensity; source relates to light source; pupil relates to projection system; and mask relates to projected patterns. However, in other embodiments, the values of the masked light intensity and the reflected light intensity may be calculated using data collected from previous wafer production cycles.

Additionally, a reference intensity ($I_{ref}$) is also provided as an input to the OPC model. The reference intensity ($I_{ref}$) is calculated by multiplying the masked light intensity by a reflection ratio ($\text{Ratio}_{ref}$). The reflection ratio is determined as a function of the following: a pattern density of the topography layer model ($PD_{topo}$), a reflection index of the photoresist layer model ($n_0$), and a reflection index of the topography layer model ($n_{topo}$). For example, in an embodiment, the ratio_ref=F (PD_topo, n_topo) means the following:
The Ratio_ref was obtained by model regression;
I_total=Photo intensity (I_0)+Reflection intensity (I_ref);
I_reflection was calculate by Ration_ref*I_0;
I_0 was calculated by Hopkin's equation; and
Ratio_ref was an parameter in model regression.

Using the inputs 510, 520, and 535, the OPC model module 530 outputs an OPC model. The OPC model, which compensates for topography reflection effects, is provided as input to the regression module 540. For example, in an embodiment, by topography model, one can predict the wafer CD (which was influenced by topography). As such, one could size up or down the DOM (dimension on mask) until the predicted CD meets the target.

The regression module 540 uses the OPC model and the ADI CD data 520 to tune the OPC model and create a revised OPC model. In the revised OPC model, a local CD bias for features in the designed test patterns 510 is tuned using the ADI CD data 520. For example, in an embodiment, one can define a cost function as the model accuracy index, such as cost function is the average of model error (e.g., Model Predict CD−Actual Wafer CD). Then, the user could perform regression on the model by adjusting parameters in the model. Therefore, one could find the best model having has the smallest average model error.

Figure 8:
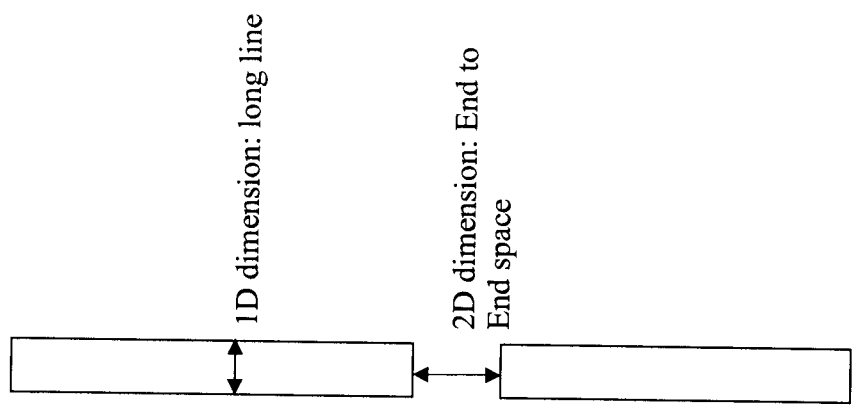
FIG. 8 is a diagram illustrating 1-D and 2-D patterns according to aspects of the present disclosure.

Thus, embodiments of the present disclosure, as compared to conventional IC methods, define local bias requirements for IC design layout features. Conventional solutions of using a global rule to add a predetermined bias to photoresist lines and/or trenches that are smaller than a predetermined size may not work with 2-D patterns. However, embodiments of the present disclosure may be used for both 1-D and 2-D patterns. FIG. 8 illustrates that 1-D patterns mean no long line or long trench patterns, which have the same width in an x or y direction. One may exclude 1-D patterns were the 2-D patterns, such as end to end space are used. Accordingly, embodiments of the present disclosure may be used with more complicated IC design layouts and scenarios where a complex topography are involved. Furthermore, embodiments of the present disclosure enable the determination of a local CD bias to address topography reflection effects.

Another of several advantages of some embodiments of the present disclosure over conventional methods of IC inspection is cost savings. For example, with embodiments of the present disclosure, the cost of implementing methods involving DBARC may be avoided. Embodiments of the present disclosure differ from methods involving DBARC, because embodiments of the present disclosure determine local bias to be applied to IC design layouts in order to compensate for the occurrence of topography reflection effects. In contrast, methods using DBARC prevent the occurrence of topography reflection effects through the use of anti-reflective materials.

One of the broader forms of an embodiment of the invention involves an integrated circuit (IC) method that includes providing an IC design layout that includes a design feature, and determining whether a total light intensity striking a portion of a photoresist layer during exposure will cause a difference in a CD of a photoresist feature that corresponds to the design feature. The total light intensity includes a masked light intensity component and a reflected light intensity component. The method further includes modifying the CD of the design feature to compensate for the difference, thereby generating a modified IC design layout, and making a mask using the modified IC design layout.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
    determining a total light intensity exposure for a portion of a photoresist layer, wherein determining the total light intensity exposure for the portion of the photoresist layer includes determining a masked light intensity component and a reflected light intensity component; and
    creating, by a computer, an optical proximity correction (OPC) model that uses the total light intensity exposure to identify a feature of an IC design layout that requires a local bias to compensate for a difference between a critical dimension (CD) of the feature of the IC design layout and a CD of a corresponding feature of the photoresist layer, wherein the OPC model identifies the difference by the reflected light intensity component exceeding a predetermined threshold.

2. The method of claim 1, wherein determining the total light intensity exposure further comprises:
    determining a product of the masked light intensity component and a reflection ratio, wherein the reflection ratio is determined using at least one of a pattern density of a topography layer, a reflection index of the photoresist layer, and a reflection index of the topography layer.

3. The method of claim 1, further comprising:
    providing CD data related to a wafer produced using the layout design, the wafer having a plurality of features; and
    performing a regression analysis using the CD data to tune the OPC model.

4. The method of claim 3, wherein performing the regression analysis using the CD data to tune the OPC model comprises tuning the OPC model using after-development-inspection (ADI) data related to the wafer.

5. The method of claim 1, wherein determining the total light intensity exposure for a portion of the photoresist layer further comprises using a reflection model to determine at least one of the masked light intensity and the reflected light intensity.

6. The method of claim 1, wherein the reflected light intensity component is determined using an integration model.

7. The method of claim 1, wherein determining the reflected light intensity component includes determining an intensity of light reflected by a material layer formed below the portion of photoresist layer, and
    wherein the OPC model identifies the difference based on the intensity of the light reflected by the material layer formed below the portion of photoresist layer exceeding the predetermined threshold.

8. An apparatus having a non-transitory computer-readable medium, the non-transitory computer-readable medium having instructions executable by a processor, the instructions comprising:
    instructions that determine a total light intensity exposure for a portion of a photoresist layer, wherein determining the total light intensity exposure for the portion of the photoresist layer includes determining a masked light intensity component and a reflected light intensity component; and
    instructions that create an optical proximity correction (OPC) model that uses the total light intensity exposure to identify a feature of an IC design layout that requires a local bias to compensate for a difference between a critical dimension (CD) of the feature of the IC design layout and the CD of a corresponding feature of the photoresist layer, wherein the OPC model identifies the difference by the reflected light intensity component exposure exceeding a predetermined threshold.

9. The apparatus of claim 8, wherein the instructions that create the OPC model using the total light intensity exposure comprise:
    instructions that determine a product of the masked light intensity component and a reflection ratio, wherein the reflection ratio is calculated using at least one of a pattern density of a topography layer, a reflection index of the photoresist layer, and a reflection index of the topography layer.

10. The apparatus of claim 8, wherein the instructions that create an OPC model using the total light intensity exposure comprise:
    instructions that provide critical dimension (CD) data related to a wafer produced using the IC design layout, the wafer having a plurality of features;
    instructions that perform a regression analysis using the CD data to tune the OPC model.

11. The apparatus of claim 10, wherein instructions that perform a regression analysis using the CD data to tune the OPC model comprise instructions that tune the OPC model using after-development-inspection (ADI) data related to the wafer.

12. The apparatus of claim 10, wherein instructions that determine the total light intensity exposure for a portion of a photoresist layer further comprise instructions that use a reflection model to determine at least one of the masked light intensity and the reflected light intensity.

13. The apparatus of claim 8, wherein the instructions further comprise instructions that determine the reflected light intensity component using an integration model.

14. A method comprising:
   determining a total light intensity exposure for a portion of a photoresist layer, wherein determining the total light intensity exposure for the portion of the photoresist layer includes determining a masked light intensity component and a reflected light intensity component; and
   creating, by a computer, an optical proximity correction (OPC) model that determines whether the reflected light intensity component for the portion of the photoresist layer exceeds a predetermined value thereby causing a difference in a critical dimension (CD) of a feature of the IC design layout and a CD of a corresponding feature of the photoresist layer.

15. The method of claim 14, wherein the portion of the photoresist layer includes a reversed region, the reversed region being a region of the photoresist layer exposed by the reflected light intensity component above the predetermined value.

16. The method of claim 14, wherein the OPC model identifies the feature of the IC design layout as requiring a local bias to compensate when the OPC model determines that the reflected light intensity component striking the portion of the photoresist layer during exposure exceeds the predetermined value.

17. The method of claim 14, further comprising tuning the OPC model using after-development-inspection (ADI) data.

18. The method of 14, wherein determining the total light intensity exposure further comprises determining a product of the masked light intensity component and a reflection ratio, and
   wherein the reflection ratio is determined using a pattern density of a topography layer, a reflection index of the photoresist layer, and a reflection index of the topography layer.

19. The method of 14, further comprising:
   providing CD data related to a wafer produced using the IC design layout; and
   performing a regression analysis using the CD data to tune the OPC model.

20. The method of 19, wherein performing the regression analysis using the CD data to tune the OPC model comprises tuning the OPC model using after-development-inspection (ADI) data related to the wafer.

* * * * *